United States Patent
Wu et al.

(10) Patent No.: US 8,531,216 B1
(45) Date of Patent: Sep. 10, 2013

(54) ELECTRONIC APPARATUS AND CLOCK GENERATING METHOD THEREOF

(75) Inventors: Jin-Xiao Wu, New Taipei (TW); Heng-Chih Lin, Hsinchu (TW); Yi-Bin Hsieh, New Taipei (TW)

(73) Assignee: Ralink Technology Corp., Jhubei, Hsinchu County (TW)

( * ) Notice: Subject to any disclaimer, the term of this patent is extended or adjusted under 35 U.S.C. 154(b) by 0 days.

(21) Appl. No.: 13/557,172

(22) Filed: Jul. 24, 2012

(51) Int. Cl.
*H03L 7/00* (2006.01)

(52) U.S. Cl.
USPC ............... 327/144; 327/145; 327/291

(58) Field of Classification Search
USPC .......................... 327/144–147, 291
See application file for complete search history.

(56) References Cited

U.S. PATENT DOCUMENTS

| | | | | |
|---|---|---|---|---|
| 7,626,462 B1 * | 12/2009 | Hietala et al. | | 331/2 |
| 7,634,028 B2 * | 12/2009 | Crawley | | 375/326 |
| 8,224,374 B2 * | 7/2012 | Kato et al. | | 455/550.1 |
| 8,301,098 B2 * | 10/2012 | Uehara et al. | | 455/260 |
| 8,379,757 B1 * | 2/2013 | Zhang et al. | | 375/295 |

* cited by examiner

*Primary Examiner* — Kenneth B Wells
(74) *Attorney, Agent, or Firm* — Winston Hsu; Scott Margo

(57) ABSTRACT

The present invention discloses an electronic apparatus. The electronic apparatus comprises a reference oscillator, for generating a reference clock; a first communications module, comprising a first auto frequency control unit, for detecting a first frequency offset between the first communications module and a first communication device and generating a first detecting result; and a first frequency synthesizer, for adjusting the reference clock according to the first detecting result, to generate a first baseband clock; and a second communications module, comprising a second auto frequency control unit, for detecting a second frequency offset between the second communications module and a second communication device and generating a second detecting result; a second frequency synthesizer, for receiving and outputting the first baseband clock; and a compensation unit, for adjusting the first baseband clock according to the first detecting result and the second detecting result, to generate a second baseband clock.

16 Claims, 8 Drawing Sheets

ELECTRONIC APPARATUS AND CLOCK GENERATING METHOD THEREOF

BACKGROUND

The present invention relates to an electronic apparatus and clock generating method thereof, and more particularly, to an electronic apparatus capable of using a single reference oscillator to generate baseband clocks corresponding to different communications standards and clock generating method thereof.

Generally, in a wireless communications system, a communications module receives data signals from a base station (BS), and obtains corresponding data by means of frequency down-converting, demodulation, decoding, etc. However, when a frequency offset between the communications module and the corresponding BS is too large, accuracy of the demodulation operation may be corrupted. For ensuring demodulation quality of the communications module, it is essential to eliminate the frequency offset (i.e. carrier frequency offset) between the communications module and the corresponding BS.

Please refer to FIG. 1, which is a schematic diagram illustrating frequency adjustment of a prior art communications module during a signal receiving procedure. In the signal receiving procedure, a mixer of the communications module multiplies a carrier clock with the received data signals. The carrier clock may be generated and outputted from a baseband processing unit with reference to a baseband clock. A frequency of the carrier clock provided for the mixer should be identical to a frequency of a BS carrier clock for accurate demodulation, and a communications block operates to remove a carrier frequency offset between the communications module and the BS when the carrier frequency offset is detected. In FIG. 1, a baseband processing unit adjusts a frequency of a baseband clock by using an Automatic Frequency Control (AFC) unit when a frequency offset is obtained at T1. Supposing a frequency offset between the communications module and the corresponding BS is estimated as $\Delta f$ as shown in FIG. 1, the frequency offset $\Delta f$ may be removed by using the AFC unit to adjust a frequency of the baseband clock by a frequency variation $\beta$. By adjusting the frequency of the baseband clock outputted from the frequency synthesizer by the frequency variation $\beta$, the frequency of the carrier clock becomes the same as that of the BS carrier clock.

With the development of electronic technologies, a modern electronic apparatus, such as a mobile device, may support more than one communications service, such as GSM/GPRS/EGPRS (GGE), Bluetooth, Wireless Fidelity (WiFi), Worldwide Interoperability for Microwave Access (WiMAX) wireless communications service, power line communications (PLC), and so on. A modern mobile electronic device may contain many communications blocks to provide communications services corresponding to different communications standards, respectively. In addition, for reducing the design cost, a designer may be asked to integrate system-on-chips (SOCs) designed for providing communications services corresponding to different communications standards. Due to strict specifications of different communications standards, each SOC may need a precise oscillator (e.g. a crystal oscillator) to generate baseband clocks for different communications modules. However, the cost of the precise oscillator is very high. For reducing the production cost, all the SOC may share a single precise oscillator. In such a situation, how to share a single precise oscillator for different SOCs has become a goal in the art.

SUMMARY

Therefore, the present invention discloses an electronic apparatus capable of using a single precise oscillator to generate different baseband clock to system-on-ships corresponding to different communications standards and method thereof.

The present invention discloses an electronic apparatus. The electronic apparatus comprises a reference oscillator, for generating a reference clock; a first communications module, comprising a first auto frequency control unit, for detecting a first frequency offset between the first communications module and a first communication device and generating a first detecting result; and a first frequency synthesizer, coupled to the reference oscillator and the first auto frequency control unit, for adjusting the reference clock according to the first detecting result, to generate a first baseband clock; and a second communications module, comprising a second auto frequency control unit, for detecting a second frequency offset between the second communications module and a second communication device and generating a second detecting result; and a second frequency synthesizer, coupled to the first communications module and the second auto frequency control unit, for receiving and outputting the first baseband clock; and a compensation unit, coupled to the first auto frequency control unit, the second auto frequency control unit and the second frequency synthesizer for adjusting the first baseband clock according to the first detecting result and the second detecting result, to generate a second baseband clock.

The present invention further discloses an electronic apparatus. The electronic apparatus comprises a reference oscillator, for generating a first reference clock; a first communications module, comprising a first auto frequency control unit, for detecting a first frequency offset between the first communications module and a first communication device; a first frequency synthesizer, coupled to the reference oscillator and the first auto frequency control unit, for adjusting the first reference clock according to the first frequency offset, to generate a first baseband clock; and a first compensation unit, coupled to the first auto frequency control unit and the first frequency synthesizer for adjusting the first baseband clock according to the first frequency offset, to generate a second reference clock; and a second communications module, comprising a second auto frequency control unit, for detecting a second frequency offset between the second communications module and a second communication device; a second frequency synthesizer, coupled to the first compensation unit and the second auto frequency control unit, for receiving and outputting the second reference clock; and a second compensation unit, coupled to the second auto frequency control unit and the second frequency synthesizer, for adjusting the second reference clock according to the second frequency offset, to generate a second baseband clock.

The present invention further discloses a clock generating method. The clock generating method comprises detecting a first frequency offset between a first communications module and a first communication device, and a second frequency offset between a second communications module and a second communication device; generating a first baseband clock to the first communications module by adjusting a reference clock according to the first frequency offset; and generating a second baseband clock to the second communications module by adjusting the first baseband clock according to the first frequency offset and the second frequency offset.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
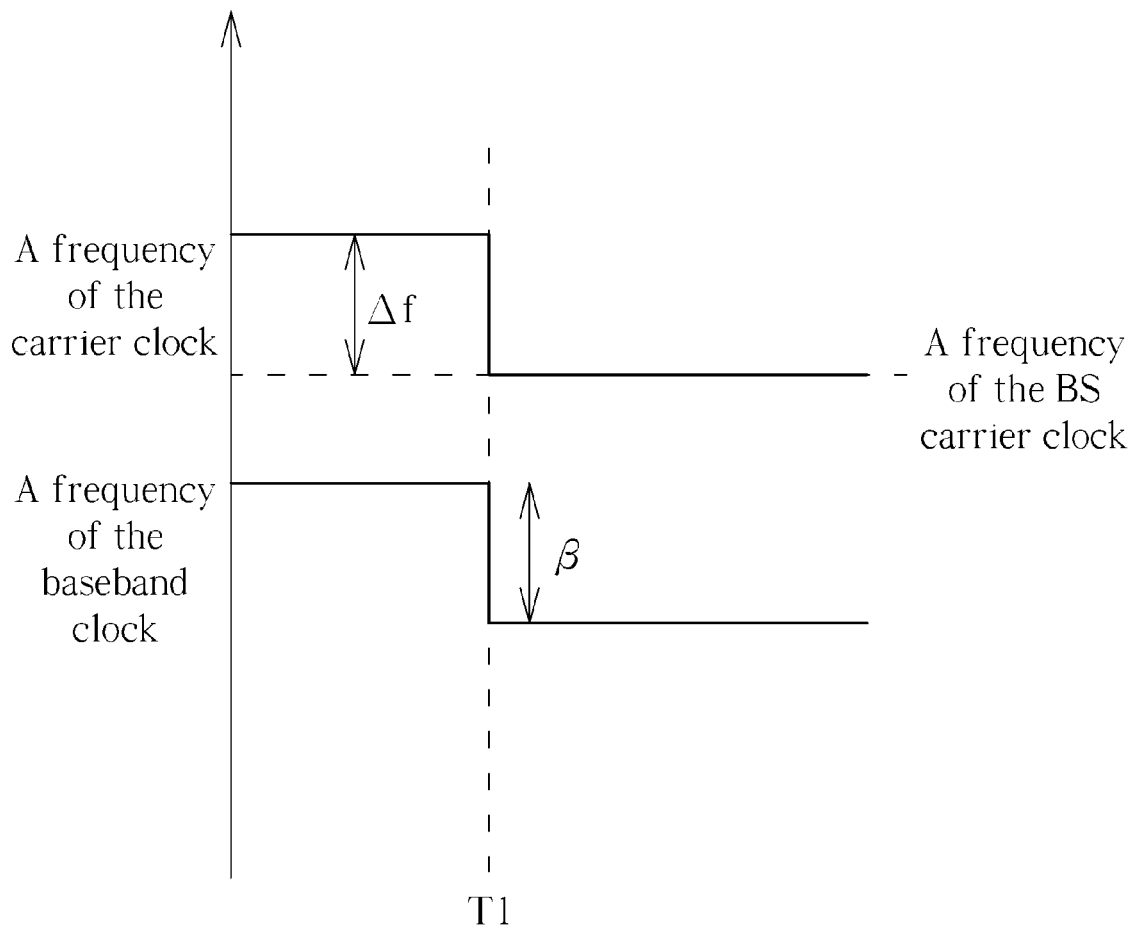
FIG. 1 is a schematic diagram illustrating frequency adjustment of a communications module during a signal receiving procedure in the prior art.
Figure 2:
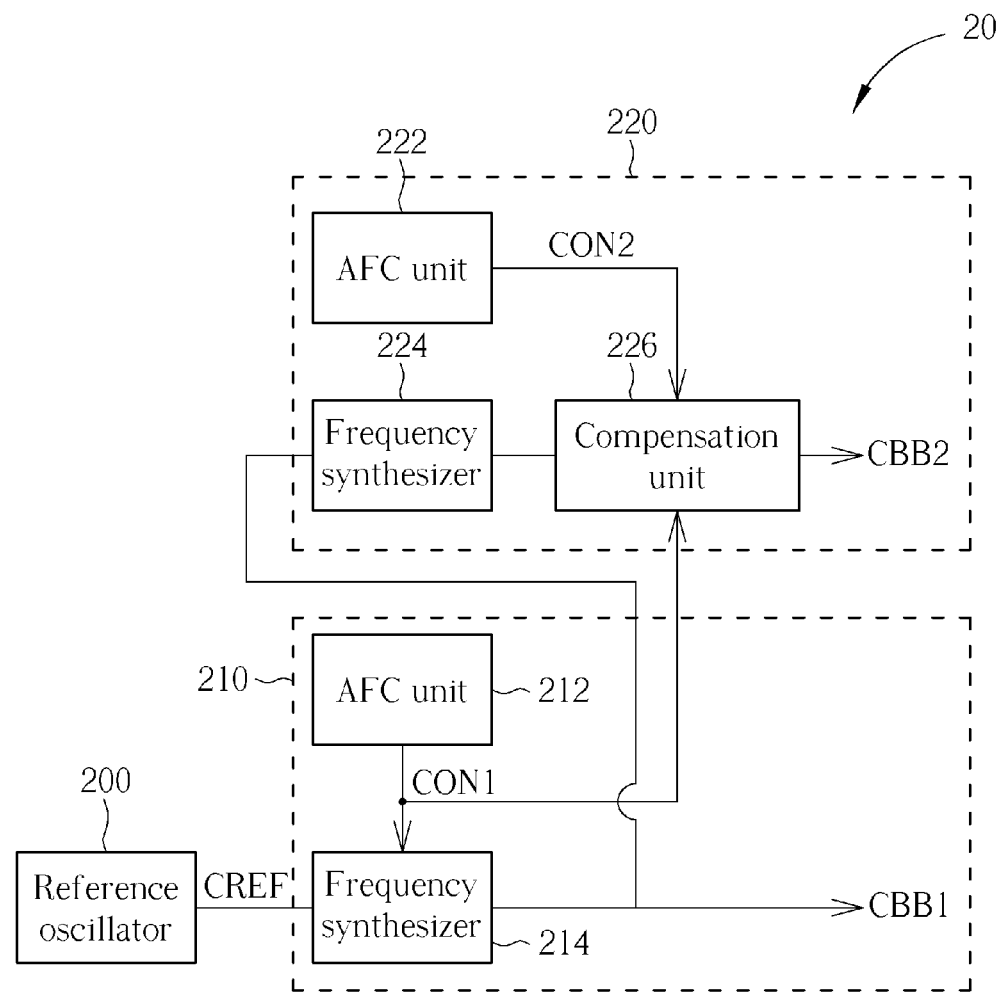
FIG. 2 is a schematic diagram of an electronic apparatus according to an embodiment of the present invention.

Please refer to FIG. 2, which is a schematic diagram of an electronic apparatus 20 according to an embodiment of the present invention. The electronic apparatus 20 is used to provide baseband clocks to communications modules corresponding to different communications standards, wherein the communications modules may be integrated on different system-on-chips (SOCs). As shown in FIG. 2, the electronic apparatus 20 comprises a reference oscillator 200 and communications modules 210, 220, wherein the communications modules 210, 220 may respectively support different communications standards, such as WIFI, PLC, WiMAX, etc., and may be integrated on the different SOCs. The reference oscillator 200 is a precise oscillator such as a crystal oscillator and is utilized for generating a reference clock CREF for the communications module 210. The communications module 210 comprises an auto frequency control (AFC) unit 212 and a frequency synthesizer 214, and is used for detecting a frequency offset $\Delta f1$ between a carrier clock CC1 of the communications module 210 and a BS carrier clock CBS1 of a first communication device, such as a base station (not shown), and generating a baseband clock CBB1 according to the reference clock CREF and the frequency offset $\Delta f1$. In addition, the communications module 210 further transmits a frequency control signal CON1 related to the frequency offset $\Delta f1$ and the baseband clock CBB1 to the communications module 220. The communications module 220 comprises an AFC unit 222, a frequency synthesizer 224 and a compensation unit 226, and is utilized for detecting a frequency offset $\Delta f2$ between a carrier clock CC2 of the communications module 220 and a BS carrier clock CBS2 of a second communication device, such as a base station (not shown), and generating a baseband clock CBB2 according to the baseband clock CBB1, the frequency offset $\Delta f2$, and the frequency control signal CON1. As a result, the electronic apparatus 20 is capable of using the reference oscillator 200 (i.e. a single oscillator) to generate baseband clocks for the communications modules 210, 220 which may be corresponding to different communications standards.

In detail, in the communications module 210, the AFC unit 212 detects the frequency offset $\Delta f1$ between a frequency FCC1 of the carrier clock CC1 and a frequency FBS1 of the BS carrier clock CBS1, and accordingly generates the frequency control signal CON1 to the frequency synthesizer 214 and the compensation unit 226. Note that, if the communications modules 210, 220 are integrated on different SOCs, the frequency control signal CON1 is transmitted by a connection interface, such as Serial Peripheral Interface (SPI), Inter-Integrated Circuit (I$^2$C), etc. The frequency synthesizer 214 then generates the baseband clock CBB1 by adjusting a frequency FBB1 of the baseband clock CBB1 according to a frequency FREF of the reference clock CREF and the frequency control signal CON1. For example, the frequency synthesizer 214 shifts the frequency FREF by a frequency deviation $\beta 1$, to acquire the frequency FBB1 of the baseband clock CBB1. After the frequency FBB1 equals the reference frequency FREF shifted by the frequency deviation $\beta 1$, the frequency FCC1 equals the frequency FBS1. In other words, the frequency offset $\Delta f1$ is removed.

In addition to transmitting the baseband clock CBB1 to other communications blocks of the communications module 210 for generating the carrier clock CC1, the communications module 210 transmits the baseband clock CBB1 to the communications module 220 for generating the baseband clock CBB2. In the communications module 220, the AFC unit 222 detects the frequency offset $\Delta f2$ between a frequency FCC2 of the carrier clock CC2 and a frequency FBS2 of the BS carrier clock CBS2, and accordingly generates a frequency control signal CON2 to the compensation unit 226. The frequency synthesizer 224 is used for receiving and outputting the first baseband clock CBB1. Different from the communications module 210, the communications module 220 further comprises the compensation unit 226 for generating the baseband clock CBB2. The compensation unit 226 firstly adjusts a frequency FBB2 of the baseband clock CBB2 from the frequency FBB1 to the frequency FREF according to the frequency control signal CON1, and then adjusts the frequency FBB2 from the frequency FREF according to the frequency control signal CON2. For example, if the frequency FBB1 equals the frequency FREF shifted by the frequency deviation 131, the compensation unit 226 firstly shifts the frequency FBB1 by the frequency deviation $\beta 1$, such that the frequency FBB2 equals the frequency FREF. Next, the compensation unit 226 adjusts the frequency FBB2 by a frequency deviation $\beta 2$, to generate the baseband clock CBB2. In short, the compensation unit 226 shifts the frequency FBB1 by a sum of the frequency deviation $\beta 1$ and the frequency deviation $\beta 2$, to generate the baseband clock CC2. After the frequency FBB2 equals the frequency FBB1 shifted by the sum of the frequency deviation $\beta 1$ and the frequency deviation $\beta 2$, the frequency FCC2 equals the frequency FBS2. As a result, the electronic apparatus 20 can use the reference oscillator 200 to generate baseband clocks CBB1, CBB2 of the communications modules 210, 220 which correspond to different communications standards.

Figure 3:
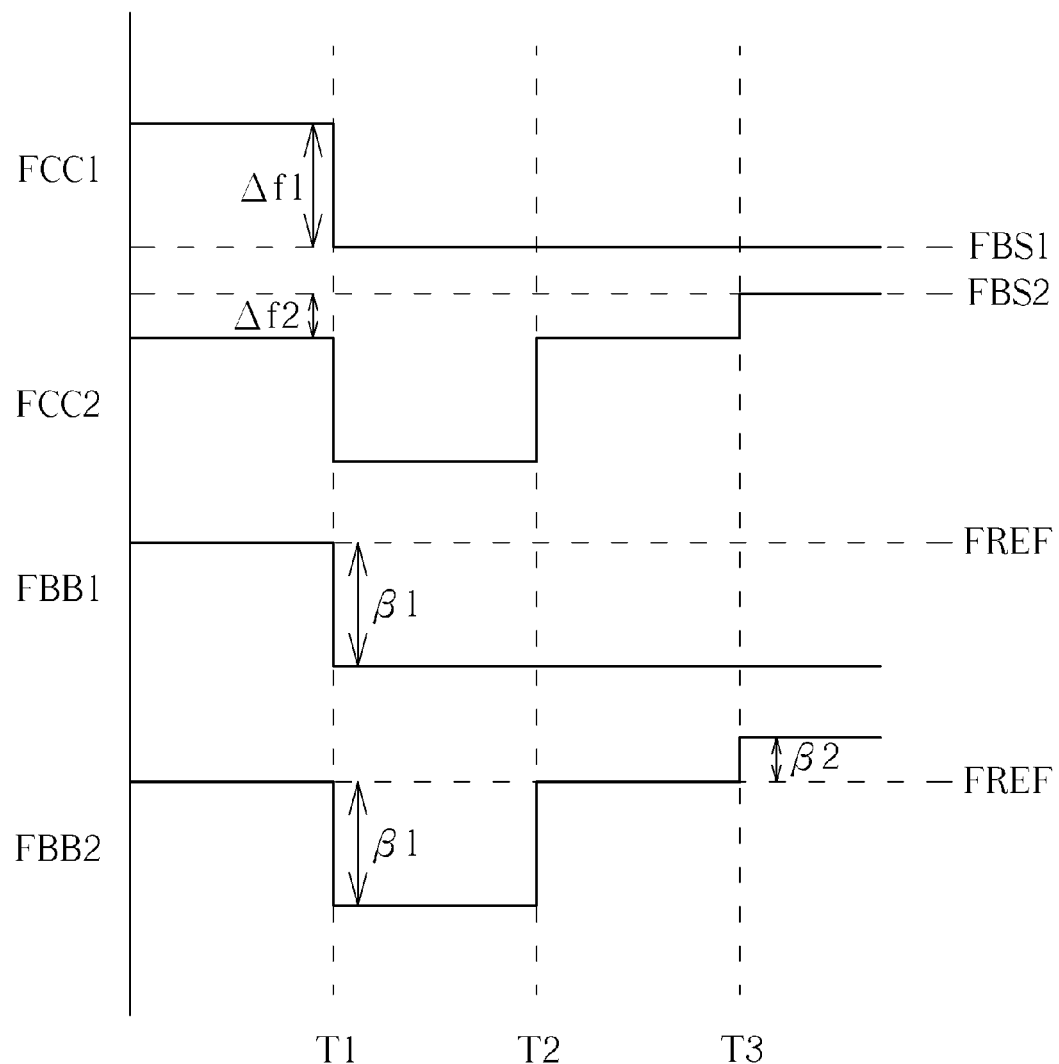
FIG. 3 is a schematic diagram of related signals when the electronic apparatus shown in FIG. 2 is operating.

Please refer to FIG. 3, which is a schematic diagram of related signals when the electronic apparatus 20 shown in FIG. 2 is operating. As shown in FIG. 3, before a time T1, the AFC unit 212 detects the frequency offset $\Delta f1$ between the frequency FCC1 of the carrier clock CC1 and the frequency FBS1 of the BS carrier clock CBS1, and the AFC unit 222 detects the frequency offset $\Delta f2$ between the frequency FCC2 of the carrier clock CC2 and the frequency FBS2 of the BS carrier clock CBS2. At the time T1, the AFC unit 212 adjusts the frequency control signal CON1 according to the frequency offset $\Delta f1$. At the same time, the frequency synthesizer 214 adjusts the frequency FBB1 from the frequency FREF by the frequency deviation $\beta 1$, to generate the baseband clock CBB1 and remove the frequency offset $\Delta f1$ of the carrier clock CC1. At a time T2, the compensation unit 226 receives the baseband clock CBB1 and the frequency control signal CON1. The compensation unit 226 then recovers the frequency FBB2 from the frequency FBB1 to the frequency FREF according to the frequency control signal CON1. At a time T3, the AFC unit 222 adjusts the frequency control signal CON2 according to the frequency offset $\Delta f2$. At the same time, the compensation unit 226 adjusts the frequency FBB2 from the frequency FREF by the frequency deviation $\beta 2$, to eliminate the frequency offset $\Delta f2$ of the frequency of the carrier clock CC2. As a result, the baseband clocks CBB1 and the baseband clock CBB2 can be generated by only using the reference oscillator 200. Note that, the sequence of the times T1, T2 and T3 are only for explaining the concept of this embodiments, and can be changed or occurred at the same time as long as the baseband clocks CBB1, CBB2 can be appropriately generated.

Figure 4:
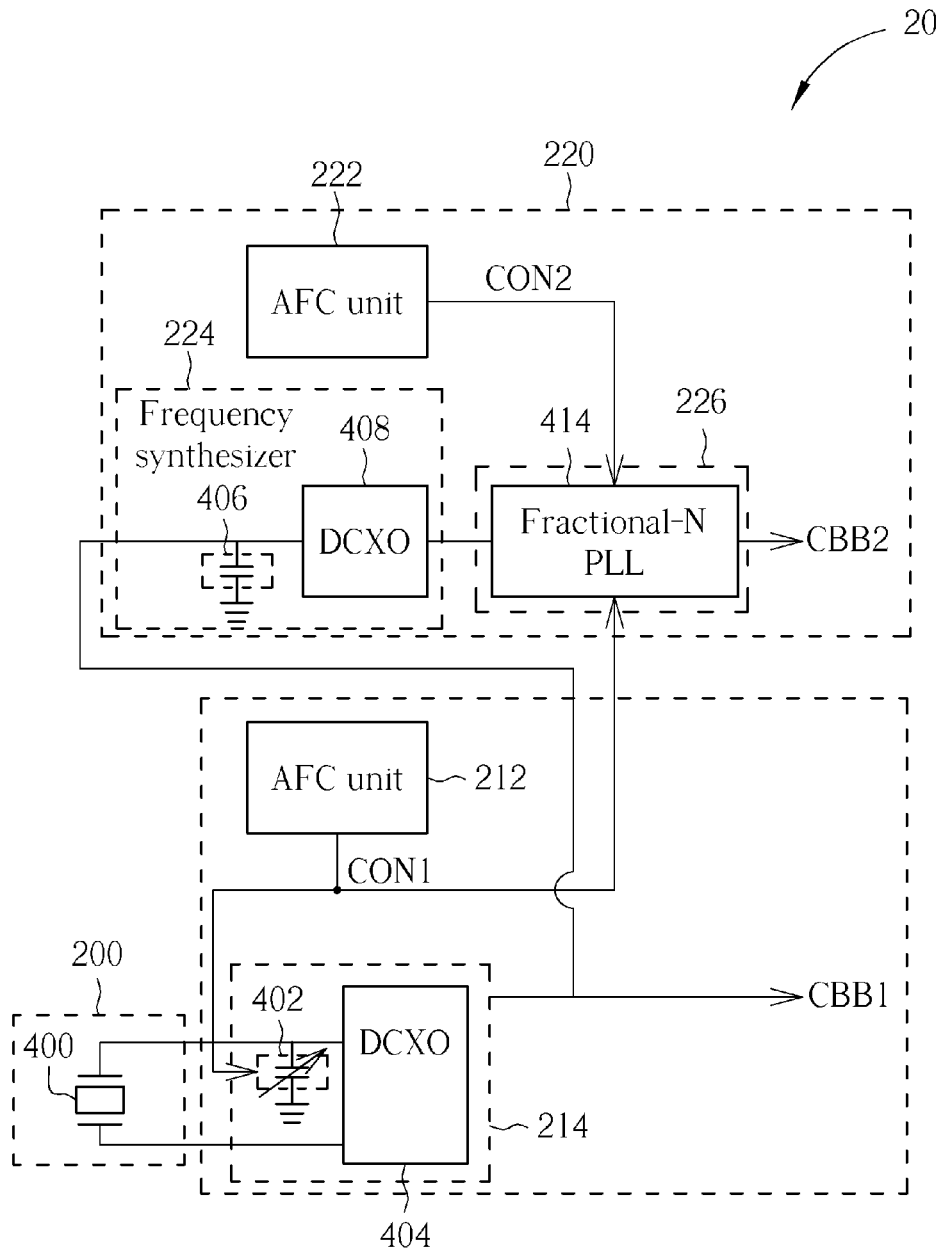
FIG. 4 is a schematic diagram of an exemplary implementation of the electronic apparatus shown in FIG. 2.

Noticeably, the spirit of the present invention is to use a single reference oscillator to generate a first baseband clock of a first communications module according to a first frequency offset, and then use the first baseband clock to generate a second baseband clock of a second communications module according to a second frequency offset and a signal related to the first frequency offset. In short, the present invention can use the single reference oscillator to generate baseband clocks for communications modules corresponding to different communications standards by transmitting the signal related to the first frequency offset. According to different applications, those skilled in the art can observe appropriate modifications and alternations. For example, please refer to FIG. 4, which is a schematic diagram of an exemplary implementation of the electronic apparatus 20 shown in FIG. 2. As shown in FIG. 4, the reference oscillator 200 is implemented in a crystal oscillator 400. The frequency synthesizer 212 is achieved by a capacitor 402 and a digital compensated crystal oscillator (DCXO) 404. The clock CBB1 can be adjusted via changing a capacitance of the capacitor 402 according to the frequency control signal CON1. Similarly, the frequency synthesizer 222 is achieved by a capacitor 408 and a DCXO 408. The compensation unit 226 is achieved by a fractional-N phase locked loop (PLL) 410. The operation principles of the electronic apparatus 20 shown in FIG. 4 can be referred to the above, and are not narrated herein for brevity.

Figure 5:
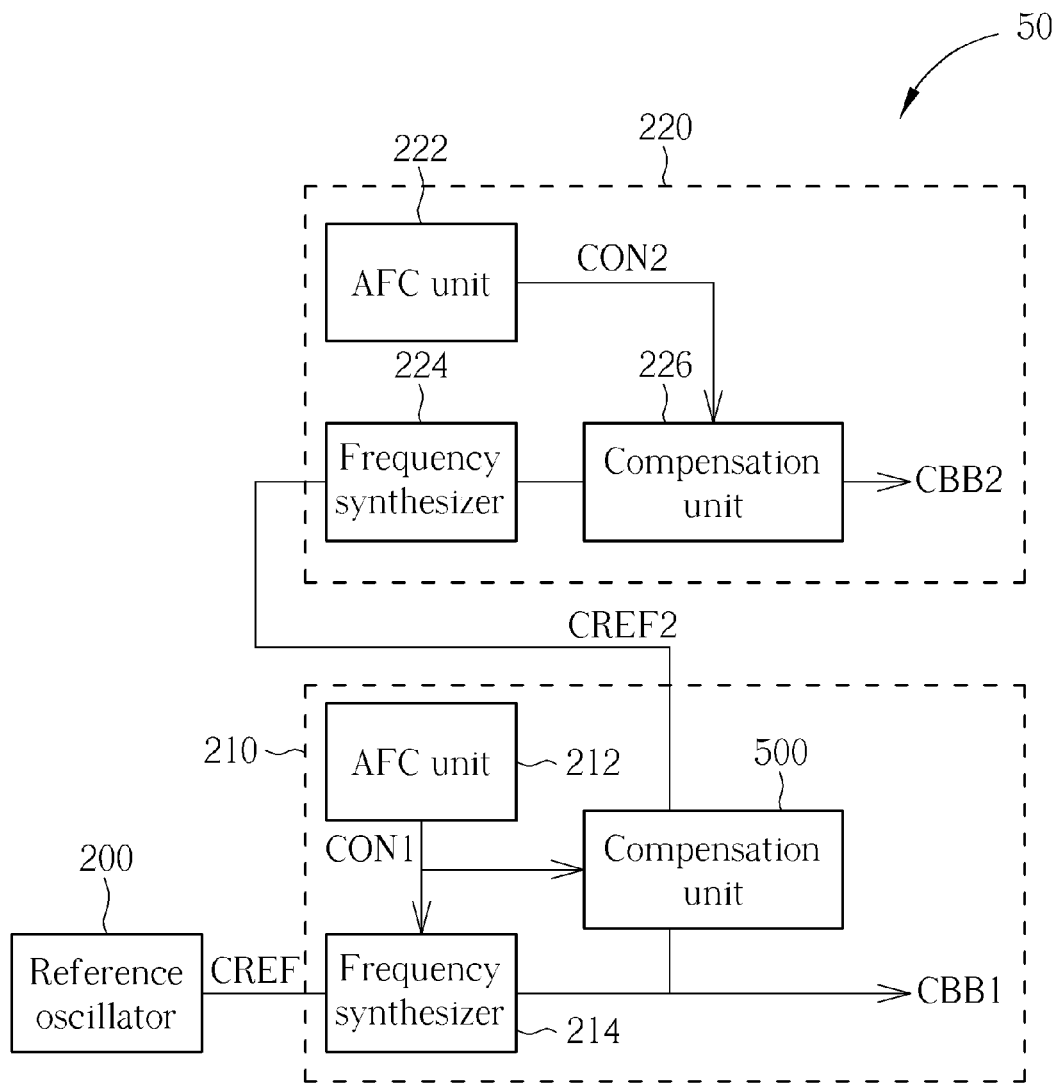
FIG. 5 is a schematic diagram of an electronic apparatus according to another embodiment of the present invention.

Please refer to FIG. 5, which is a schematic diagram of an electronic apparatus 50 according to an embodiment of the present invention. Similar to the electronic apparatus 20, the electronic apparatus 50 is utilized for generating baseband clocks of communications modules corresponding to different communications standards. The structure of the electronic apparatus 50 is similar to that of the electronic apparatus 20, so the same symbols and components are used. The differences between the electronic apparatus 50 and the electronic apparatus 20 are that the communications module 210 further comprises a compensation unit 500. The compensation unit 500 is used for generating a reference clock CREF2 via adjusting a frequency FREF2 of the reference clock CREF2 from the frequency FBB1 of the baseband clock CBB1 to the frequency FREF of the reference clock CREF according to the frequency control signal CON1. Since the frequency FREF2 had recovered to the frequency FREF, the compensation unit 226 only has to adjust the frequency FBB2 according to the frequency control signal CON2. As a result, the electronic apparatus 50 can also use the reference oscillator 200 to generate baseband clocks CBB1, CBB2 of the communications modules 510, 520 which correspond to different communications standards.

Figure 6:
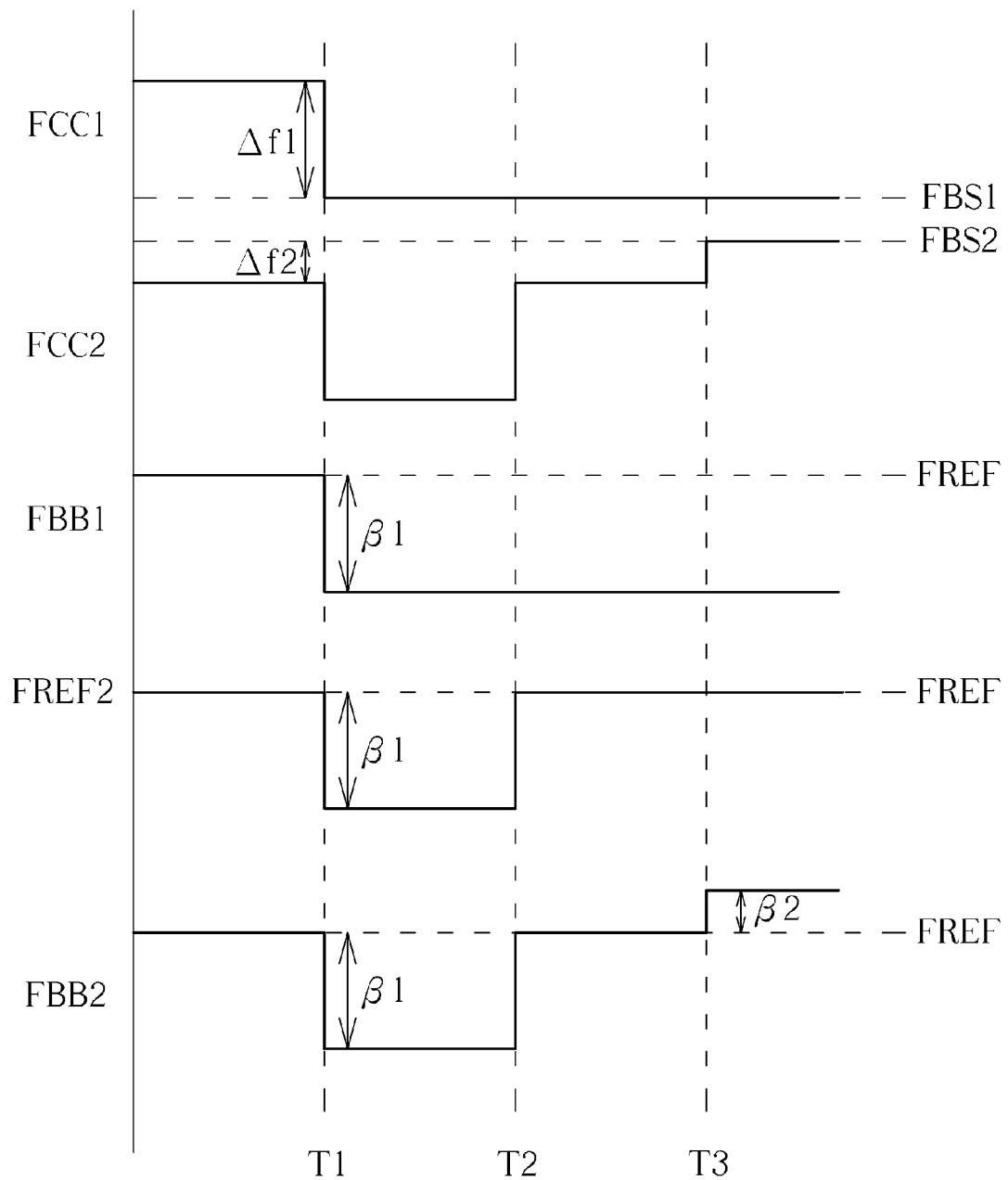
FIG. 6 is a schematic diagram of related signals when the electronic apparatus shown in FIG. 5 is operating.

Please refer to FIG. 6, which is a schematic diagram of related signals when the electronic apparatus 50 is operating. As shown in FIG. 6, before a time T1, the frequency FCC1 of the carrier clock CC1 is greater than the frequency FBS1 by the frequency offset $\Delta f1$ and the frequency FCC2 is slower than the frequency FBS2 by the frequency offset $\Delta f2$. At the time T1, the frequency synthesizer 214 adjusts the frequency FBB1 according to the frequency offset $\Delta f1$. In this embodiment, the frequency synthesizer 214 adjusts the frequency FBB1 by the frequency deviation $\beta 1$, such that the frequency FCC1 equals the frequency FBS1. At a time T2, the compensation unit 500 then receives the baseband clock CBB1 and adjusts the frequency FREF2 according to the frequency FBB1 and the frequency offset $\Delta f1$, to generate the reference clock CREF2. In this embodiment, the compensation unit 516 recovers the frequency FBB1 by the frequency deviation $\beta 1$, such that the frequency FREF2 equals the frequency FREF. At a time T3, the compensation unit 226 receives the reference clock CREF2 and adjusts the frequency FREF2 according to the frequency offset $\Delta f2$ to generate the baseband clock CBB2. In this embodiment, the compensation unit 226 adjusts the frequency FREF2 by the frequency deviation $\beta 2$, such that the frequency FCC2 equals the frequency FBS2. As a result, the electronic apparatus 50 can generate the baseband clocks CBB1, CBB2 by using the reference oscillator 500. Note that, the sequence of the times T1, T2 and T3 are only for explaining the concept of this embodiments, and can be changed or occurred at the same time as long as the baseband clocks CBB1, CBB2 can be appropriately generated.

Figure 7:
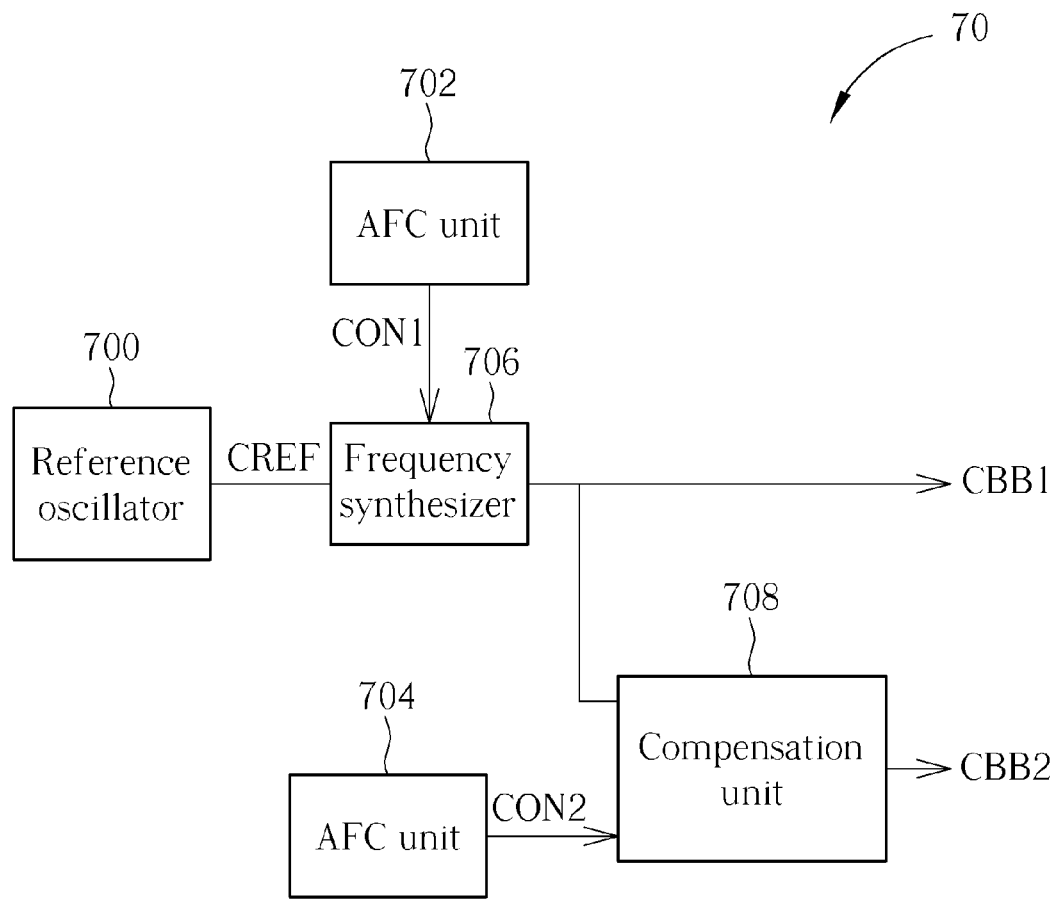
FIG. 7 is a schematic diagram of an electronic apparatus according to another embodiment of the present invention.

In addition, the communications modules corresponding to different communications standards may further be integrated into a SOC. Please refer to FIG. 7, which is a schematic diagram of an electronic apparatus 70 according to an embodiment of the present invention. The electronic apparatus 70 is utilized for generating baseband clocks to a first communications module and a second communications module which correspond to different communications standards. As shown in FIG. 7, the electronic apparatus 70 comprises a reference oscillator 700, AFC units 702, 704, a frequency synthesizer 706, and compensation unit 708. The reference oscillator 700, the AFC unit 702, the AFC unit 704, the frequency synthesizer 706, and the compensation unit 708 are similar to those of the reference oscillator 200, the AFC unit 212, the AFC unit 222, the frequency synthesizer 214 and the compensation unit 226 of the apparatus 20. Therefore, detailed operations of the electronic apparatus 70 can be referred to the above, and are not described herein for brevity.

Figure 8:
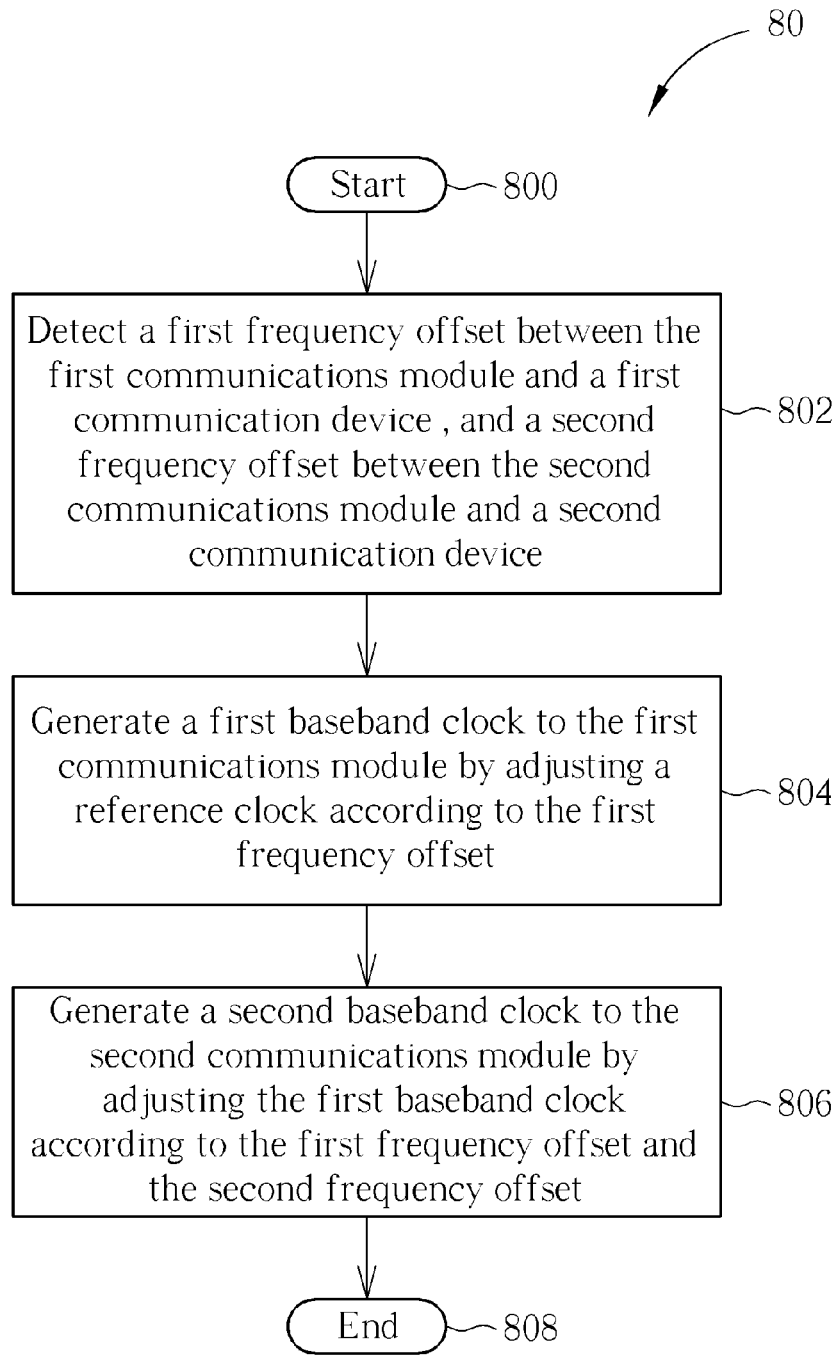
FIG. 8 is a schematic diagram of the clock generating method according to an embodiment of the present invention.

The operations mentioned above can be summarized to a clock generating method 80, as shown in FIG. 8. The clock generating method is utilized for generating baseband clocks of a first communications module and a second communications module which separately corresponding to different communications standards and are integrated on different SOCs. As shown in FIG. 8, the clock generating method 80 comprises:

Step 800: Start.

Step 802: Detect a first frequency offset between the first communications module and a first communication device, and a second frequency offset between the second communications module and a second communication device.

Step 804: Generate a first baseband clock to the first communications module by adjusting a reference clock according to the first frequency offset.

Step 806: Generate a second baseband clock to the second communications module by adjusting the first baseband clock according to the first frequency offset and the second frequency offset.

Step 808: End.

The detailed operations of the clock generating method 80 can be referred to above description, and are not narrated herein for brevity. According to different applications, the steps of the clock generating method 80 can be appropriately modified. For example, the step 806 can be divided into two steps which comprise:

Step 806a: Recover the first baseband clock according to the first frequency offset in the first communications module, to generate a second reference clock to the second communications module; and Step 806b: Generate a second baseband clock according to the second reference clock and the second frequency offset in the second communications module.

To sum up, the present invention uses a single reference oscillator to generate baseband clocks of communications modules which correspond to different communications standards. In comparison with the prior art, the present invention effectively reduces the manufacturing cost by using only a single reference oscillator.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic apparatus, comprising:
a reference oscillator, for generating a reference clock;
a first communications module, comprising:
a first auto frequency control unit, for detecting a first frequency offset between the first communications module and a first communication device and generating a first detecting result; and
a first frequency synthesizer, coupled to the reference oscillator and the first auto frequency control unit, for adjusting the reference clock according to the first detecting result, to generate a first baseband clock; and
a second communications module, comprising:
a second auto frequency control unit, for detecting a second frequency offset between the second communications module and a second communication device and generating a second detecting result; and
a second frequency synthesizer, coupled to the first communications module and the second auto frequency control unit, for receiving and outputting the first baseband clock; and
a compensation unit, coupled to the first auto frequency control unit, the second auto frequency control unit and the second frequency synthesizer for adjusting the first baseband clock according to the first detecting result and the second detecting result, to generate a second baseband clock.

2. The electronic apparatus of claim 1, wherein the first communications module and the second communications module correspond to different communications standards.

3. The electronic apparatus of claim 1, wherein the first communications module and the second communications module are integrated in different system-on-chips.

4. The electronic apparatus of claim 1, wherein the first frequency offset is eliminated after the first frequency synthesizer generates the first baseband clock by adjusting the reference clock according to the first detecting result.

5. The electronic apparatus of claim 4, wherein the second frequency offset is eliminated after the compensation unit generates the second baseband clock by adjusting the first baseband clock according to the first detecting result and the second detecting result.

6. An electronic apparatus, comprising:
a reference oscillator, for generating a first reference clock;
a first communications module, comprising:
a first auto frequency control unit, for detecting a first frequency offset between the first communications module and a first communication device;
a first frequency synthesizer, coupled to the reference oscillator and the first auto frequency control unit, for adjusting the first reference clock according to the first frequency offset, to generate a first baseband clock; and
a first compensation unit, coupled to the first auto frequency control unit and the first frequency synthesizer for adjusting the first baseband clock according to the first frequency offset, to generate a second reference clock; and
a second communications module, comprising:
a second auto frequency control unit, for detecting a second frequency offset between the second communications module and a second communication device;
a second frequency synthesizer, coupled to the first compensation unit and the second auto frequency control unit, for receiving and outputting the second reference clock; and
a second compensation unit, coupled to the second auto frequency control unit and the second frequency synthesizer, for adjusting the second reference clock according to the second frequency offset, to generate a second baseband clock.

7. The electronic apparatus of claim 6, wherein the first communications module and the second communications module correspond to different communications standards.

8. The electronic apparatus of claim 6, wherein the first communications module and the second communications module are integrated in different system-on-chips.

9. The electronic apparatus of claim 6, wherein the first frequency offset is eliminated after the first frequency synthesizer generates the first baseband clock by adjusting the reference clock according to the first frequency offset.

10. The electronic apparatus of claim 9, wherein a frequency of the second reference clock equals a frequency of first reference clock after the first compensation unit generates the second reference clock by adjusting the first baseband clock according to the first frequency offset.

11. The electronic apparatus of claim 10, wherein the second frequency offset is eliminated after the second compensation unit generates the second baseband clock by adjusting the second reference clock according to the second frequency offset.

12. A clock generating method, comprising:
detecting a first frequency offset between a first communications module and a first communication device, and a second frequency offset between a second communications module and a second communication device;
generating a first baseband clock to the first communications module by adjusting a reference clock according to the first frequency offset; and
generating a second baseband clock to the second communications module by adjusting the first baseband clock according to the first frequency offset and the second frequency offset.

13. The clock generating method of claim 12, wherein the first communications module and the second communications module are corresponding to different communications standards.

14. The clock generating method of claim 13, wherein the first communications module and the second communications module are integrated in different system-on-chips.

15. The clock generating method of claim 12, wherein the step of generating a first baseband clock to the first communications module by adjusting a reference clock according to the first frequency offset further comprises:

generating a first baseband clock to the first communications module by adjusting a reference clock according to the first frequency offset, to eliminate the first frequency offset.

16. The clock generating method of claim 12, wherein the step of generating a second baseband clock to the second communications module by adjusting the first baseband clock according to the first frequency offset and the second frequency offset further comprises:

generating a second baseband clock to the second communications module by adjusting the first baseband clock according to the first frequency offset and the second frequency offset, to eliminate the second frequency offset.

\* \* \* \* \*